United States Patent
Matsudai et al.

(10) Patent No.: US 6,380,566 B1
(45) Date of Patent: Apr. 30, 2002

(54) SEMICONDUCTOR DEVICE HAVING FET STRUCTURE WITH HIGH BREAKDOWN VOLTAGE

(75) Inventors: Tomoko Matsudai, Tokyo; Yusuke Kawaguchi, Miura-gun; Kazutoshi Nakamura; Hirofumi Nagano, both of Yokohama; Akio Nakagawa, Hiratsuka, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 50 days.

(21) Appl. No.: 09/669,737

(22) Filed: Sep. 26, 2000

(30) Foreign Application Priority Data

Sep. 28, 1999 (JP) ............................. 11-274708

(51) Int. Cl.[7] .................... H01L 29/74; H01L 31/111
(52) U.S. Cl. .................. 257/175; 257/133; 257/139
(58) Field of Search ................. 257/133, 139, 257/175

(56) References Cited

U.S. PATENT DOCUMENTS 5,932,897 A * 8/1999 Kawaguchi et al.
6,236,068 B1 * 5/2001 Feiler
6,297,534 B1 * 10/2001 Kawaguchi et al.

FOREIGN PATENT DOCUMENTS

| EP | 571027 A1 * | 11/1993 |
| JP | 8-181321 | 7/1996 |
| JP | 9-139438 | 5/1997 |

OTHER PUBLICATIONS

S. Merchant, et al., "Energy Capability of Lateral and Vertical DMOS Transistors in an Advanced Automotive Smart Power Technology," Proceedings of 1998 International Symposium on Power Semiconductor Devices and ICs, 1998, pp. 317–320.

* cited by examiner

Primary Examiner—Stephen D. Meier
(74) Attorney, Agent, or Firm—Oblon, Spivak, McClelland, Maier & Neustadt, P.C.

(57) ABSTRACT

An N-MOSFET is formed on an SOI substrate consisting of a semiconductor substrate, an insulating layer and an n⁻-active layer. A p-well layer, an n-RESURF layer, and an n-diffusion layer are formed in the surface of the n⁻-active layer between a source electrode and a drain electrode by means of impurity diffusion. The diffusion regions of the p-well layer and the n-RESURF layer overlap with each other. An end of the n-RESURF layer reaches a position below a gate electrode. The diffusion regions of the p-well layer and the n-diffusion layer do not overlap with each other, so that the n-RESURF layer has a region in direct contact with the n⁻-active layer between the p-well layer and the n-diffusion layer.

20 Claims, 3 Drawing Sheets

SEMICONDUCTOR DEVICE HAVING FET STRUCTURE WITH HIGH BREAKDOWN VOLTAGE

CROSS-REFERENCE TO RELATED APPLICATIONS

This application is based upon and claims the benefit of priority from the prior Japanese Patent Application No. 11-274708, filed Sep. 28, 1999, the entire contents of which are incorporated herein by reference.

BACKGROUND OF THE INVENTION

The present invention relates to a semiconductor device having an FET (Field Effect Transistor) structure with a high breakdown voltage, which is of the MOS (Metal Oxide Semiconductor) type or the MIS (Metal Insulator Semiconductor) type, and more particularly to a semiconductor device with a high breakdown voltage, using an SOI (Silicon On Insulator) substrate.

FIG. 9 is a sectional view schematically showing a lateral MOSFET as a conventional semiconductor device with a high breakdown voltage.

In this MOSFET, an n-embedded layer 102 having a low resistivity is formed on a p-semiconductor substrate 101 by means of epitaxial growth. An n-layer 104 having a high resistivity is formed on the n-embedded layer 102 by means of epitaxial growth.

A p-body layer 105 is formed selectively in the surface of the n-epitaxial layer 104. An n-source layer 106 having a low resistivity and a p-contact layer 107 having a low resistivity are formed selectively in the surface of the p-body layer 105. A source electrode 108 is disposed on the n-source layer 106 and the p-contact layer 107.

An n-drain layer 109 having a low resistivity is formed selectively in the surface of the n-epitaxial layer 104, such that it is separated from the p-body layer 105 by a predetermined distance. A drain electrode 110 is disposed on the n-drain layer 109.

A gate electrode 112 having a field plate is disposed via a gate oxide film on the region between the n-drain layer 109 and the n-source layer 106. The gate electrode 112 is arranged to induce an n-channel in the surface of the p-body layer 105 between the n-epitaxial layer 104 and the n-source layer 106.

In this MOSFET, when a power supply voltage is applied to the n-drain layer 109, a depletion layer extending from the p-body layer 105 to the n-epitaxial layer 104 is formed to correspond to the shape of the p-body layer 105. In this case, since an electric field is intensified at a portion corresponding to the lower corner of the p-body layer 105, it is difficult to obtain a high breakdown voltage without reducing the impurity concentration of the n-epitaxial layer 104.

However, where the impurity concentration of the n-epitaxial layer 104 is low, when the device is turned on with a voltage applied to the gate electrode 112 higher than the threshold voltage, the resistivity of the n-epitaxial layer 104 becomes high, thereby increasing the ON-resistance of the device.

BRIEF SUMMARY OF THE INVENTION

The present invention has been made in consideration of the problem of the prior art, and its object is to provide a semiconductor device having an FET structure with a high breakdown voltage, which can realize a low ON-resistance while maintaining a high breakdown voltage.

According to a first aspect of the present invention, there is provided a semiconductor device with a high breakdown voltage comprising:

a semiconductor substrate;

an insulating layer disposed on the semiconductor substrate;

an active layer disposed on the insulating layer;

a RESURF (Reduced Surface Field) layer of a first conductivity type formed selectively in the active layer;

a drain layer of the first conductivity type formed selectively in the RESURF layer;

a drain electrode disposed to be in contact with the drain layer;

a well layer of a second conductivity type formed selectively in the active layer;

a source layer of the first conductivity type formed selectively in the well layer;

a source electrode disposed to be in contact with the well layer and the source layer; and a gate electrode disposed via a gate insulating film on a region of the well layer between the source layer and the RESURF layer;

wherein the RESURF layer and the well layer are formed by diffusing impurities of the first and second conductivity types, respectively, such that an end of the RESURF layer reaches a position below the gate electrode, the RESURF layer and the well layer are formed of diffusion regions overlapping with each other, and the RESURF layer has a region in direct contact with the active layer between the drain layer and the well layer, whereby a carrier concentration gradient is formed in the RESURF layer such that a concentration of carriers of the first conductivity type decreases toward the well layer side.

According to a second aspect of the present invention, there is provided a semiconductor device with a high breakdown voltage comprising:

a semiconductor substrate;

an insulating layer disposed on the semiconductor substrate;

an active layer disposed on the insulating layer;

a RESURF layer of a first conductivity type formed selectively in the active layer;

a drain layer of the first conductivity type formed selectively in the RESURF layer;

a drain electrode disposed to be in contact with the drain layer;

a well layer of a second conductivity type formed selectively in the active layer;

a source layer of the first conductivity type formed selectively in the well layer;

a source electrode disposed to be in contact with the well layer and the source layer;

a gate electrode disposed via a gate insulating film on a region of the well layer between the source layer and the RESURF layer; and a diffusion layer of the first conductivity type formed selectively in the active layer to overlap with the RESURF layer and the drain layer;

wherein the RESURF layer and the well layer are formed by diffusing impurities of the first and second conductivity types, respectively, and the diffusion layer is formed by diffusing an impurity of the first conductivity type at a dose higher than that of the RESURF layer, such that an end of the RESURF layer reaches a position below the gate electrode, the diffusion layer and the well layer are formed of diffusion regions not overlapping with each other, and the RESURF layer has a region in direct contact with the active layer between the diffusion layer and the well layer, whereby a carrier concentration gradient is formed in the RESURF layer such that a concentration of carriers of the first conductivity type increases toward the diffusion layer side.

According to a third aspect of the present invention, there is provided a semiconductor device with a high breakdown voltage comprising:

an active layer;

a RESURF layer of a first conductivity type formed selectively in the active layer;

a drain layer of the first conductivity type formed selectively in the RESURF layer;

a drain electrode disposed to be in contact with the drain layer;

a well layer of a second conductivity type formed selectively in the active layer;

a source layer of the first conductivity type formed selectively in the well layer;

a source electrode disposed to be in contact with the well layer and the source layer;

a gate electrode disposed via a gate insulating film on a region of the well layer between the source layer and the RESURF layer; and a diffusion layer of the first conductivity type formed selectively in the active layer to overlap with the RESURF layer and the drain layer;

wherein the RESURF layer and the well layer are formed by diffusing impurities of the first and second conductivity types, respectively, and the diffusion layer is formed by diffusing an impurity of the first conductivity type at a dose higher than that of the RESURF layer, such that an end of the RESURF layer reaches a position below the gate electrode, the RESURF layer and the well layer are formed of diffusion regions overlapping with each other, the diffusion layer and the well layer are formed of diffusion regions not overlapping with each other, and the RESURF layer has a region in direct contact with the active layer between the diffusion layer and the well layer, whereby carrier concentration gradients are formed in the RESURF layer such that a concentration of carriers of the first conductivity type decreases toward the well layer side, and a concentration of carriers of the first conductivity type increases toward the diffusion layer side.

The semiconductor device with a high breakdown voltage according to any one of the first to third aspects may further comprise a base layer of the second conductivity type formed selectively in the well layer to extend into a region below the gate electrode, wherein the source layer is formed selectively in the base layer.

According to any one of the first to third aspects, it is possible to provide a semiconductor device having a FET structure with a high breakdown voltage, which can realize a high breakdown voltage in a reversely biased state, and a low ON-resistance and a high ON-breakdown voltage in an ON state, all together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
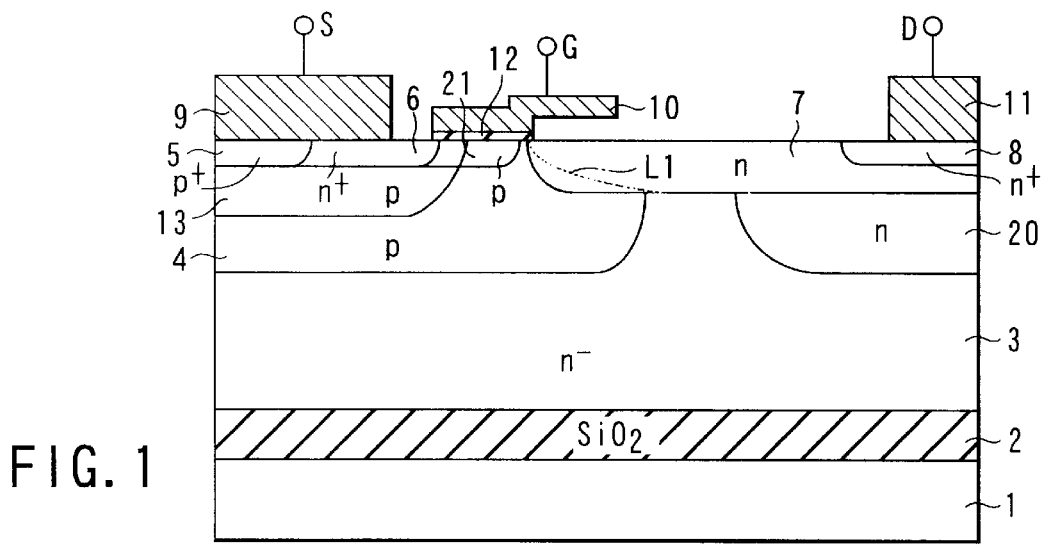
FIG. 1 is a sectional view schematically showing a lateral N-MOSFET as a semiconductor device with a high breakdown voltage according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional view schematically showing a lateral N-MOSFET as a semiconductor device with a high breakdown voltage according to an embodiment of the present invention.

The MOSFET shown in FIG. 1 is formed, using an SOI substrate. More specifically, on a silicon substrate 1, an insulating layer 2 consisting of an SiO$_2$ embedded oxide film, and an n$^-$-, i.e., an n-type of a high resistivity, silicon active layer 3 are formed in this order.

An n-RESURF (Reduced Surface Field) layer 7 is formed in the surface of the n$^-$-active layer 3, and an n$^+$-, i.e., an n-type of a low resistivity, drain layer 8 is formed in the n-RESURF layer 7. A drain electrode 11 is disposed on the n$^+$-drain layer 8 to be in contact therewith. An n-diffusion layer 20 is further formed in the n$^-$-active layer 3 on the drain electrode 11 side, while using a mask opening width smaller than that of the n-RESURF layer 7. The n-diffusion layer 20 is arranged such that its diffusion region overlaps with those of the n-RESURF layer 7 and the n$^+$-drain layer 8.

On the other hand, a p-well layer 4 is formed selectively in the surface of the n$^-$-active layer 3 on the source electrode side. A p-base layer 13 having an impurity concentration higher than that of the p-well layer 4 is formed selectively in the surface of the p-well layer 4 by means of diffusion. An n$^+$-source layer 6 is formed selectively in the surface of the p-base layer 13. A source electrode 9 is disposed on the p-well layer 4 and the n$^+$-source layer 6 to be commonly in contact therewith. A p$^+$-, i.e., a p-type of a low resistivity, contact layer 5 is formed below the source electrode 9 to obtain a satisfactory contact to the p-well layer 4.

The n-RESURF layer 7 is arranged to extend into the p-well layer 4. A p-diffusion layer 21 of so-called channel implantation having an impurity concentration higher than that of the p-well layer 4 is formed by means of diffusion in the surface of the p-well layer 4 between the n-RESURF layer 7 and n$^+$-source layer 6. The p-diffusion layer 21 is arranged to adjust the threshold voltage, and/or to improve the breakdown voltage by increasing the impurity dose. A gate electrode 10 having a field plate is disposed via a gate oxide film 12 on the p-diffusion layer 21, i.e., the region between the n-RESURF layer 7 and the n$^+$-source layer 6. The surface of the active layer between the source electrode 9 and the drain electrode 11 is covered with an insulating film (not shown) other than the gate oxide film 12.

In this embodiment, the n$^-$-active layer 3 is doped with an n-type impurity at a dose of from $1 \times 10^{10}$ to $2 \times 10^{12}$ cm$^{-2}$, and preferably from $0.5 \times 10^{12}$ to $1.8 \times 10^{12}$ cm$^{-2}$.

The p-well layer 4, the n-RESURF layer 7, and the n-diffusion layer 20 are formed by means of impurity diffusion to satisfy the following conditions. Specifically, the p-well layer 4 and the n-diffusion layer 20 are deeper than the n-RESURF layer 7. The diffusion regions of the p-well layer 4 and the n-RESURF layer 7 overlap with each other, such that one end of the RESURF layer 7 reaches a position below the gate electrode 10. The diffusion regions of the p-well layer 4 and the n-diffusion layer 20 do not overlap with each other, so that the n-RESURF layer 7 has a region in direct contact with the n$^-$-active layer 3 between the p-well layer 4 and the n-diffusion layer 20.

More specifically, the n-RESURF layer 7 is doped with an n-type impurity at a dose of from $2 \times 10^{11}$ to $1 \times 10^{13}$ cm$^{-2}$, and preferably from $1 \times 10^{12}$ to $5 \times 10^{12}$ cm$^{-2}$, such that this dose is higher than the n-type impurity dose to the n$^-$-active layer 3. Where this range is expressed in terms of the concentration and depth of the impurity, it representatively takes a surface concentration of $1 \times 10^{17}$ cm$^{-3}$, and a depth of 0.7 μm, though these values are changed in accordance with conditions. The n-diffusion layer 20 is doped with an n-type impurity at a dose higher than the n-type impurity dose to the n-RESURF layer 7.

On the other hand, the p-well layer 4 has a peak concentration of from $1 \times 10^{15}$ to $5 \times 10^{17}$ cm$^{-3}$, and preferably from $1 \times 10^{16}$ to $1 \times 10^{17}$ cm$^{-3}$, and a diffusion depth of from 2 to 5 μm.

An explanation will be given of an operation of this embodiment.

In the N-MOSFET shown in FIG. 1, it is supposed that the p-well layer 4, n$^+$-source layer 6, and the substrate 1 are supplied with a constant potential, e.g., they are grounded, and the n$^+$-drain layer 8 is supplied with a high positive voltage. In this state, a depletion layer is formed from the interface between the insulating layer 2 and the n$^-$-active layer 3, and a depletion layer is formed from the pn junction between the p-well layer 4, and the n$^-$-active layer 3 and the n-RESURF layer 7. The depletion layers thus formed take on an applied voltage, thereby realizing a high breakdown voltage.

In order to obtain a high breakdown voltage in the MOSFET, as a comparative example relative to the present invention, there is a technique of shifting a mask opening for impurity implantation little by little to form a plurality of diffusion layers, which constitute an n-RESURF layer 7. With this technique, the n-RESURF layer 7 thus formed by the multi-diffusion is provided with a corner having a relaxed curvature at the bottom, so that a concentrated electric field is prevented from occurring. The multi-diffusion becomes more effective, as the number of diffusion steps increases to increase the curvature of the n-RESURF layer 7 at the bottom.

Besides, the breakdown voltage between the source and the drain, i.e., the breakdown voltage at the pn junction between the n-RESURF layer 7 and the p-well layer 4 can be increased, where the concentration of the n-RESURF layer 7 is reduced so as not to prevent the depletion layer from extending. Where the concentration of the n-RESURF layer 7 is too high, device breakdown is caused at the distal end of the n-RESURF layer 7 before a depletion layer extends sufficiently. On the other hand, however, where the concentration of the n-RESURF layer 7 is low, the resistivity of the n-RESURF layer 7 increases, and so does the resistance of the MOSFET in an ON state.

Accordingly, it is necessary to form a concentration gradient in the n-RESURF layer 7 such that the concentration gradually increases toward the drain electrode 11 side. Also for this, it is effective to constitute the n-RESURF layer 7 of a plurality of diffusion layers formed by shifting a mask opening for impurity implantation little by little, thereby increasing the concentration of the n-RESURF layer 7 on the drain electrode 11 side. However, the number of light-exposure steps increases with an increase in the number of the diffusion layers, thereby giving rise to an increase in the manufacturing cost.

In order to solve the problem of the comparative technique, this embodiment of the present invention is designed to form the diffusion regions of the p-well layer 4 and the n-RESURF layer 7 to overlap with each other. With this arrangement, the concentration of the n-RESURF layer 7 decreases toward the end in the portion overlapping with the p-well layer 4. In other words, the n-RESURF layer 7 has a concentration gradient such that the n-type carrier concentration gradually increases from the source electrode 9 side to the drain electrode 11 side in the portion overlapping with the p-well layer 4 (see the carrier concentration profile indicated by the one-dot-chain line L1 in FIG. 1). As a result, even where the n-RESURF layer 7 is formed by means of single diffusion, it can have a concentration distribution corresponding to multi-diffusion.

Furthermore, the n-diffusion layer 20 is additionally formed, such that the diffusion regions of the p-well layer 4 and the n-diffusion layer 20 do not overlap with each other, to increase the concentration of the n-RESURF layer 7 on the drain electrode 11 side. With this arrangement, the n-RESURF layer 7 is further added with a lateral concentration gradient, so that its concentration profile becomes similar to that formed by means of multi-diffusion with a larger number of diffusion steps.

In other words, the overlap of the n-RESURF layer 7 with the p-well layer 4 creates a carrier concentration gradient in the portion of the n-RESURF layer 7 on the left side in FIG. 1, such that the n-type carrier concentration decreases toward the p-well layer 4 side. On the other hand, the overlap of the n-RESURF layer 7 with the n-diffusion layer 20 creates a carrier concentration gradient in the portion of the n-RESURF layer 7 on the right side in FIG. 1, such that the n-type carrier concentration increases toward the n-diffusion layer 20 side.

As a result, the MOSFET according to this embodiment has a high breakdown voltage and a low ON-resistance which are similar to those obtained by multi-diffusion.

Figure 2:
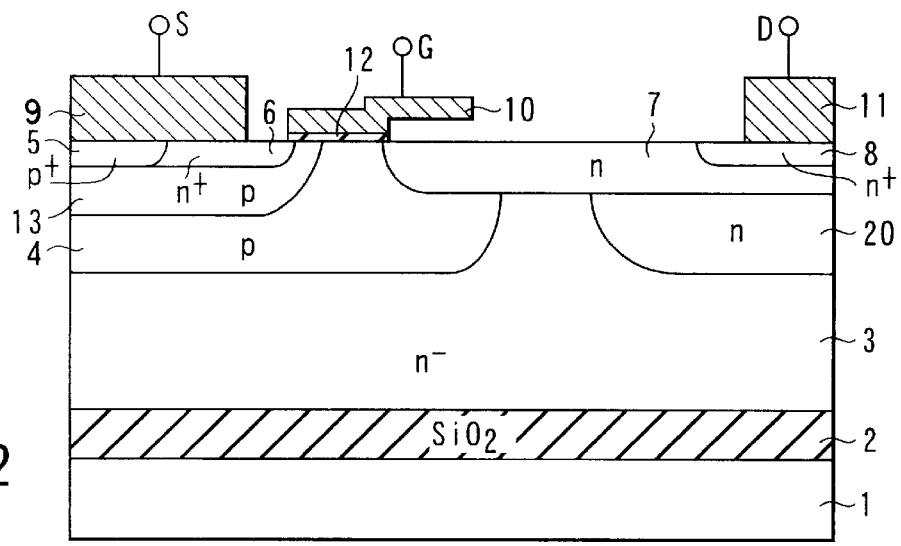
FIG. 2 is a sectional view schematically showing a lateral N-MOSFET as a semiconductor device with a high breakdown voltage according to another embodiment of the present invention.

FIG. 2 is a sectional view schematically showing a lateral N-MOSFET as a semiconductor device with a high breakdown voltage according to another embodiment of the present invention.

The MOSFET shown in FIG. 2 differs from the MOSFET shown in FIG. 1 in that the p-diffusion layer 21 of channel implantation is not formed below a gate electrode 10. The channel implantation for forming the p-diffusion layer 21 is not necessarily required, if the concentration of a p-base layer 13 and a p-well layer 4 is adjusted. In the MOSFET shown in FIG. 2, since the p-well layer 4 covers the whole channel portion, fluctuation in characteristics due to mask shift and the like is prevented, thereby easily resulting in constant characteristics.

Figure 3:
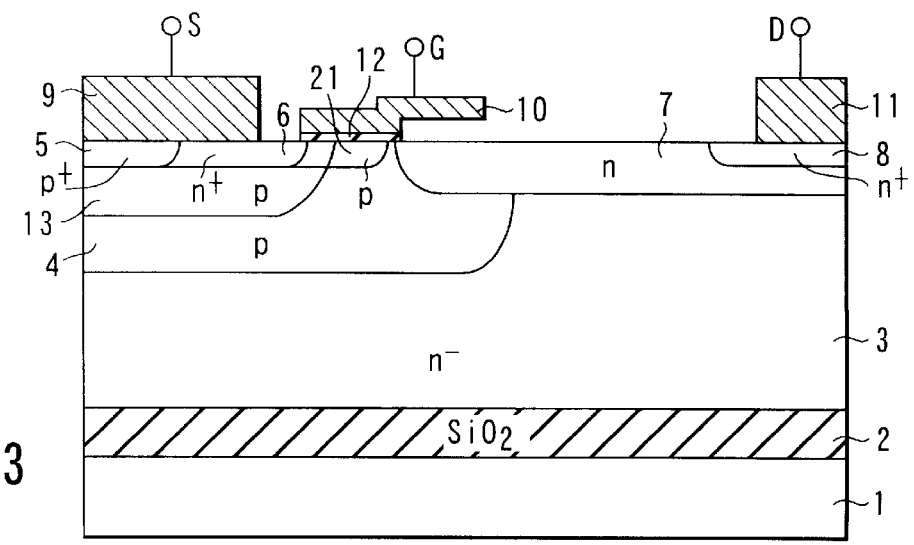
FIG. 3 is a sectional view schematically showing a lateral N-MOSFET as a semiconductor device with a high breakdown voltage according to still another embodiment of the present invention.

FIG. 3 is a sectional view schematically showing a lateral N-MOSFET as a semiconductor device with a high breakdown voltage according to still another embodiment of the present invention.

The MOSFET shown in FIG. 3 differs from the MOSFET shown in FIG. 1 in that the n-diffusion layer 20 overlapping with an n-RESURF layer 7 is not formed. In the MOSFET shown in FIG. 3, the diffusion regions of a p-well layer 4 and an n-RESURF layer 7 are arranged to overlap with each other, so that a carrier concentration gradient is formed in the overlapping portion of the n-RESURF layer 7. As a result, the MOSFET shown in FIG. 3 has a high breakdown voltage and a low ON-resistance, which are satisfactory, without using the n-diffusion layer 20.

Figure 4:
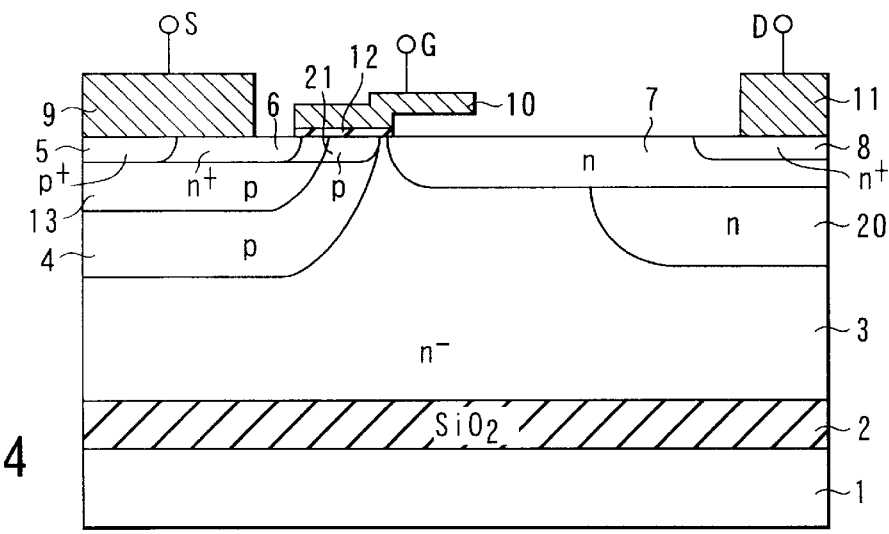
FIG. 4 is a sectional view schematically showing a lateral N-MOSFET as a semiconductor device with a high breakdown voltage according to still another embodiment of the present invention.

FIG. 4 is a sectional view schematically showing a lateral N-MOSFET as a semiconductor device with a high breakdown voltage according to still another embodiment of the present invention.

The MOSFET shown in FIG. 4 differs from the MOSFET shown in FIG. 1 in that the diffusion regions of a p-well layer 4 and an n-RESURF layer 7 are arranged not to overlap with each other. The n-RESURF layer 7 is formed to extend to a position below a gate electrode 10, the same as the position shown in FIG. 1, while the p-well layer 4 is formed shorter than that shown in FIG. 1 to terminate immediately before the end of the n-RESURF layer 7.

In the MOSFET structure, the concentration in the portion of the n-RESURF layer 7 below the gate electrode 10 is most influential in determining the ON-resistance. Accordingly, in light of the ON-resistance, it is advantageous to maintain the concentration of the n-RESURF layer 7 high by forming the left end of the n-RESURF layer 7 not to overlap with the p-well layer 4, as shown in FIG. 4.

On the other hand, it is necessary to set the concentration of the n-RESURF layer 7 to be less than a certain value, in order to prevent breakdown at the distal end of the n-RESURF layer 7 with a low voltage applied thereto, thereby maintaining the lateral breakdown voltage. For this reason, the concentration of the n-RESURF layer 7 is increased by the n-diffusion layer 20 near the drain electrode 11. As a result, the MOSFET shown in FIG. 4 has a high breakdown voltage and a low ON-resistance, which are satisfactory.

Figure 5:
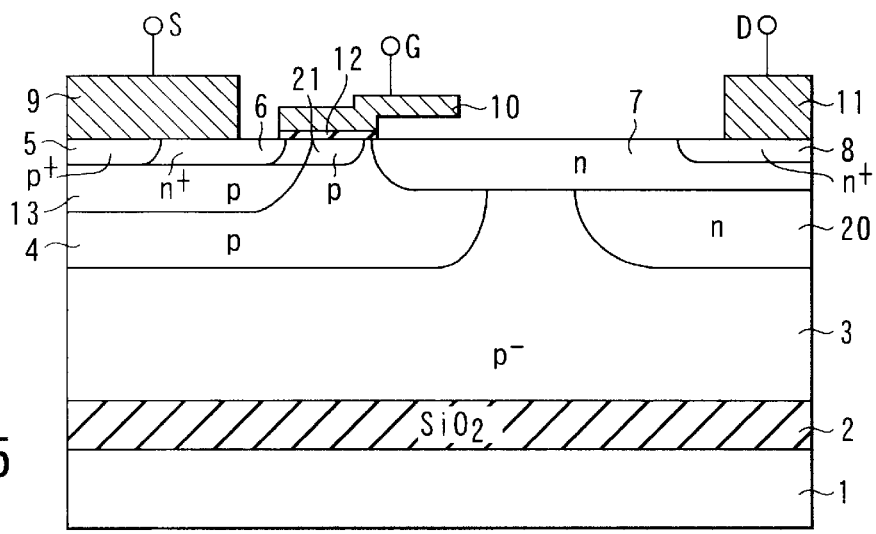
FIG. 5 is a sectional view schematically showing a lateral N-MOSFET as a semiconductor device with a high breakdown voltage according to still another embodiment of the present invention.

FIG. 5 is a sectional view schematically showing a lateral N-MOSFET as a semiconductor device with a high breakdown voltage according to still another embodiment of the present invention.

The MOSFET shown in FIG. 5 differs from the MOSFET shown in FIG. 1 in that the active layer on an insulating layer 2 consists of a p$^-$-, i.e., a p-type of a high resistivity, active layer 23. In this structure, however, since a p-well layer 4 covers the whole channel portion, the concentration of the channel portion is not affected, and neither is the ON-characteristic, while a high breakdown voltage is maintained. Where an IC circuit is constructed, the conductivity type of the substrate is required to be n-or p-type depending on the necessary characteristics of another device, such as a bipolar device. A MOSFET structure according to the present invention can result in constant characteristics without reference to the conductivity type of the substrate.

Figure 6:
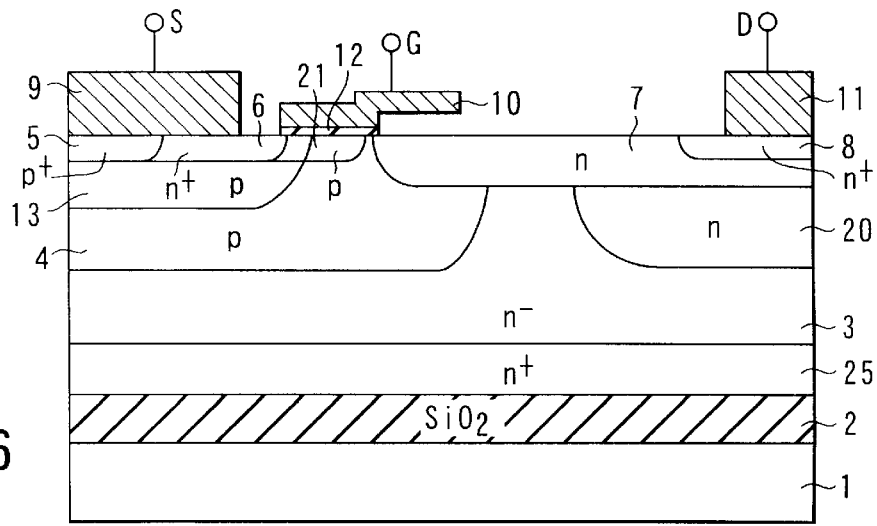
FIG. 6 is a sectional view schematically showing a lateral N-MOSFET as a semiconductor device with a high breakdown voltage according to still another embodiment of the present invention.

FIG. 6 is a sectional view schematically showing a lateral N-MOSFET as a semiconductor device with a high breakdown voltage according to still another embodiment of the present invention.

The MOSFET shown in FIG. 6 differs from the MOSFET shown in FIG. 1 in that an n$^+$-embedded layer 25 having a resistivity lower than that of an n$^-$-active layer 3 is disposed between an insulating layer 2 and the n$^-$-active layer 3. Depending on conditions for using the device, the potential of a substrate 1 is set at a value other than 0V. In order not to be affected by an inverted layer formed when a negative potential is applied to the substrate 1, the n$^+$-embedded layer 25 is disposed on the bottom of the n$^-$-active layer 3.

The n$^+$-embedded layer 25 shields the influence of the potential of the substrate 1 onto the n$^-$-active layer 3. In this case, no depletion layer is formed at the bottom of the n$^-$-active layer 3, but a depletion layer is formed from the pn junction between the p-well layer 4 and the n$^-$-active layer 3. The depletion layer thus formed takes on an applied voltage, thereby providing the necessary characteristic of breakdown voltage, without affecting the ON-characteristic. As a result, the MOSFET shown in FIG. 6 has a low ON-resistance and a high ON-breakdown voltage, which are satisfactory.

Figure 7:
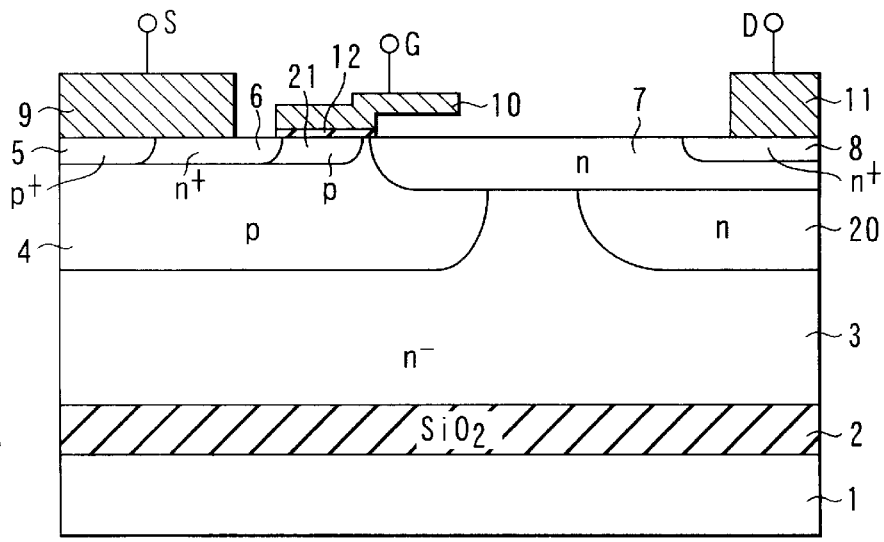
FIG. 7 is a sectional view schematically showing a lateral N-MOSFET as a semiconductor device with a high breakdown voltage according to still another embodiment of the present invention.

FIG. 7 is a sectional view schematically showing a lateral N-MOSFET as a semiconductor device with a high breakdown voltage according to still another embodiment of the present invention.

The MOSFET shown in FIG. 7 differs from the MOSFET shown in FIG. 1 in that the p-base layer 13 is not formed. The p-base layer 13 is not necessarily required, if a p-diffusion layer 21 is arranged to appropriately adjust the surface concentration of the p-well layer 4. In other words, it suffices that either the p-base layer 13 or the p-diffusion layer 21 is formed below the gate electrode 10, as shown in FIGS. 2 and 7.

Figure 8:
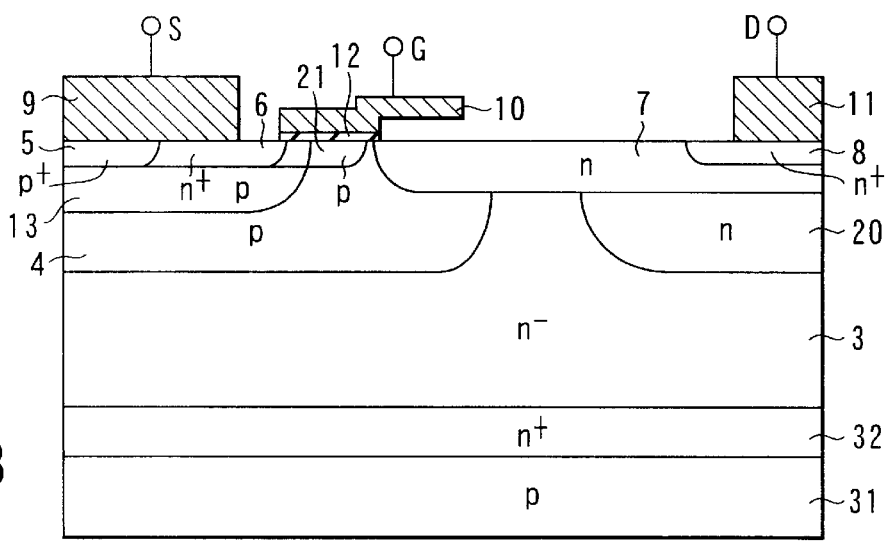
FIG. 8 is a sectional view schematically showing a lateral N-MOSFET as a semiconductor device with a high breakdown voltage according to still another embodiment of the present invention.
Figure 9:
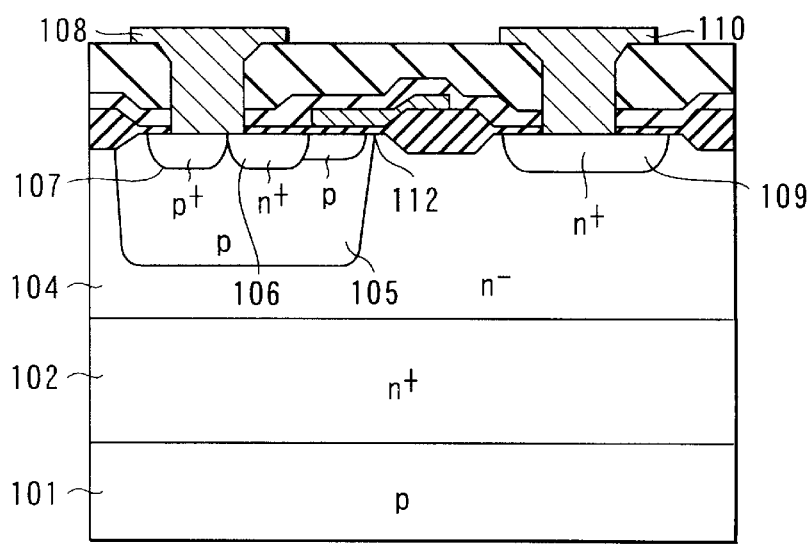
FIG. 9 is a sectional view schematically showing a lateral MOSFET as a conventional semiconductor device with a high breakdown voltage.

FIG. 8 is a sectional view schematically showing a lateral N-MOSFET as a semiconductor device with a high breakdown voltage according to still another embodiment of the present invention.

The MOSFET shown in FIG. 8 differs from the MOSFET shown in FIG. 1 in that it does not employ an SOI substrate. More specifically, an $n^+$-embedded layer 32 having a low resistivity is formed on a p-semiconductor substrate 31 by means of epitaxial growth. An $n^-$-active layer 3 is formed on the $n^+$-embedded layer 32 by means of epitaxial growth. In and on the $n^-$-active layer 3 thus formed, the MOSFET is constructed to have the same structure as the MOSFET shown in FIG. 1.

Also in this MOSFET, no depletion layer is formed at the bottom of the $n^-$-active layer 3, but a depletion layer is formed from the pn junction between the p-well layer 4 and the $n^-$-active layer 3. The depletion layer thus formed takes on an applied voltage, thereby providing the necessary characteristic of breakdown voltage, without affecting the ON-characteristic. As a result, the MOSFET shown in FIG. 8 has a low ON-resistance and a high ON-breakdown voltage, which are satisfactory.

More specifically, the MOSFET shown in FIG. 8 also has features of the present invention in that carrier concentration gradients are formed in an n-RESURF layer 7 by an overlap of the n-RESURF layer 7 with a p-well layer 4, and an overlap of the n-RESURF layer 7 with an n-diffusion layer 20. Accordingly, these features can be applied to MOSFETs of this type in common, without being limited to a structure using an SOI substrate. With these features, it is possible to provide a high breakdown voltage semiconductor device, which can realize a high breakdown voltage in a reversely biased state, and a low ON-resistance and a high ON-breakdown voltage in an ON state, all together.

Note that, although the embodiments described above are exemplified by an N-MOSFET, the present invention is also effective in a P-MOSFET that is formed by replacing the conductivity types of the layers between n- and p-types relative to the embodiments. The present invention is also effective in a high breakdown voltage semiconductor device having a MISFET structure in place of a MOSFET structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device with a high breakdown voltage comprising:
   a semiconductor substrate;
   an insulating layer disposed on the semiconductor substrate;
   an active layer disposed on the insulating layer;
   a RESURF layer of a first conductivity type formed selectively in the active layer;
   a drain layer of the first conductivity type formed selectively in the RESURF layer;
   a drain electrode disposed to be in contact with the drain layer;
   a well layer of a second conductivity type formed selectively in the active layer;
   a source layer of the first conductivity type formed selectively in the well layer;
   a source electrode disposed to be in contact with the well layer and the source layer; and
   a gate electrode disposed via a gate insulating film on a region of the well layer between the source layer and the RESURF layer;
   wherein the RESURF layer and the well layer are formed by diffusing impurities of the first and second conductivity types, respectively, such that an end of the RESURF layer reaches a position below the gate electrode, the RESURF layer and the well layer are formed of diffusion regions overlapping with each other, and the RESURF layer has a region in direct contact with the active layer between the drain layer and the well layer, whereby a carrier concentration gradient is formed in the RESURF layer such that a concentration of carriers of the first conductivity type decreases toward the well layer side.

2. The device according to claim 1, further comprising a diffusion layer of the first conductivity type formed selectively in the active layer to overlap with the RESURF layer and the drain layer, wherein the diffusion layer is formed by diffusing an impurity of the first conductivity type at a dose higher than that of the RESURF layer, such that the diffusion layer and the well layer are formed of diffusion regions not overlapping with each other, and the RESURF layer has a region in direct contact with the active layer between the diffusion layer and the well layer, whereby a carrier concentration gradient is formed in the RESURF layer such that a concentration of carriers of the first conductivity type increases toward the diffusion layer side.

3. The device according to claim 1, further comprising a base layer of the second conductivity type formed selectively in the well layer to extend into a region below the gate electrode, wherein the source layer is formed selectively in the base layer.

4. The device according to claim 1, further comprising a diffusion layer of the second conductivity type formed in the well layer to be directly below the gate electrode.

5. The device according to claim 1, wherein the active layer is of the first conductivity type.

6. The device according to claim 1, wherein the active layer is of the second conductivity type.

7. The device according to claim 1, further comprising an embedded layer of the first conductivity type having a resistivity lower than that of the active layer, and disposed between the insulating layer and the active layer.

8. A semiconductor device with a high breakdown voltage comprising:
   a semiconductor substrate;
   an insulating layer disposed on the semiconductor substrate;
   an active layer disposed on the insulating layer;
   a RESURF layer of a first conductivity type formed selectively in the active layer;
   a drain layer of the first conductivity type formed selectively in the RESURF layer;
   a drain electrode disposed to be in contact with the drain layer;
   a well layer of a second conductivity type formed selectively in the active layer;
   a source layer of the first conductivity type formed selectively in the well layer;
   a source electrode disposed to be in contact with the well layer and the source layer;
   a gate electrode disposed via a gate insulating film on a region of the well layer between the source layer and the RESURF layer; and
   a diffusion layer of the first conductivity type formed selectively in the active layer to overlap with the RESURF layer and the drain layer;

wherein the RESURF layer and the well layer are formed by diffusing impurities of the first and second conductivity types, respectively, and the diffusion layer is formed by diffusing an impurity of the first conductivity type at a dose higher than that of the RESURF layer, such that an end of the RESURF layer reaches a position below the gate electrode, the diffusion layer and the well layer are formed of diffusion regions not overlapping with each other, and the RESURF layer has a region in direct contact with the active layer between the diffusion layer and the well layer, whereby a carrier concentration gradient is formed in the RESURF layer such that a concentration of carriers of the first conductivity type increases toward the diffusion layer side.

9. The device according to claim 8, wherein the RESURF layer and the well layer are formed of diffusion regions overlapping with each other, whereby a carrier concentration gradient is formed in the RESURF layer such that a concentration of carriers of the first conductivity type decreases toward the well layer side.

10. The device according to claim 8, further comprising a base layer of the second conductivity type formed selectively in the well layer to extend into a region below the gate electrode, wherein the source layer is formed selectively in the base layer.

11. The device according to claim 8, further comprising a diffusion layer of the second conductivity type formed in the well layer to be directly below the gate electrode.

12. The device according to claim 8, wherein the active layer is of the first conductivity type.

13. The device according to claim 8, wherein the active layer is of the second conductivity type.

14. The device according to claim 12, further comprising an embedded layer of the first conductivity type having a resistivity lower than that of the active layer, and disposed between the insulating layer and the active layer.

15. A semiconductor device with a high breakdown voltage comprising:

an active layer;

a RESURF layer of a first conductivity type formed selectively in the active layer;

a drain layer of the first conductivity type formed selectively in the RESURF layer;

a drain electrode disposed to be in contact with the drain layer;

a well layer of a second conductivity type formed selectively in the active layer;

a source layer of the first conductivity type formed selectively in the well layer;

a source electrode disposed to be in contact with the well layer and the source layer;

a gate electrode disposed via a gate insulating film on a region of the well layer between the source layer and the RESURF layer; and a diffusion layer of the first conductivity type formed selectively in the active layer to overlap with the RESURF layer and the drain layer;

wherein the RESURF layer and the well layer are formed by diffusing impurities of the first and second conductivity types, respectively, and the diffusion layer is formed by diffusing an impurity of the first conductivity type at a dose higher than that of the RESURF layer, such that an end of the RESURF layer reaches a position below the gate electrode, the RESURF layer and the well layer are formed of diffusion regions overlapping with each other, the diffusion layer and the well layer are formed of diffusion regions not overlapping with each other, and the RESURF layer has a region in direct contact with the active layer between the diffusion layer and the well layer, whereby carrier concentration gradients are formed in the RESURF layer such that a concentration of carriers of the first conductivity type decreases toward the well layer side, and a concentration of carriers of the first conductivity type increases toward the diffusion layer side.

16. The device according to claim 15, further comprising a base layer of the second conductivity type formed selectively in the well layer to extend into a region below the gate electrode, wherein the source layer is formed selectively in the base layer.

17. The device according to claim 15, further comprising a diffusion layer of the second conductivity type formed in the well layer to be directly below the gate electrode.

18. The device according to claim 15, wherein the active layer is of the first conductivity type.

19. The device according to claim 18, further comprising a semiconductor layer of the second conductivity type, and a semiconductor layer of the first conductivity type having a resistivity lower than that of the active layer, and disposed on the semiconductor layer of the second conductivity type, wherein the active layer is disposed on the semiconductor layer of the first conductivity type, such that the semiconductor layer of the first conductivity type is interposed between the active layer and the semiconductor layer of the second conductivity type.

20. The device according to claim 15, further comprising a semiconductor layer and an insulating layer disposed on the semiconductor layer, wherein the active layer is disposed on the insulating layer, such that the insulating layer is interposed between the active layer and the semiconductor layer.

* * * * *